United States Patent
Zhang et al.

(10) Patent No.: US 11,841,615 B2
(45) Date of Patent: Dec. 12, 2023

(54) MASK AND METHOD FOR MANUFACTURING THE SAME, EXPOSURE SYSTEM, METHOD FOR MANUFACTURING A DISPLAY SUBSTRATE, AND DISPLAY DEVICE

(71) Applicants: CHONGQING BOE OPTOELECTRONICS TECHNOLOGY CO., LTD., ChongQing (CN); BOE TECHNOLOGY GROUP CO., LTD., Beijing (CN)

(72) Inventors: Shouqiang Zhang, Beijing (CN); Wenlin Mei, Beijing (CN); Zhuo Xu, Beijing (CN); Pengcheng Fu, Beijing (CN); Zhifu Dong, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 399 days.

(21) Appl. No.: 16/883,428

(22) Filed: May 26, 2020

(65) Prior Publication Data
US 2021/0033961 A1    Feb. 4, 2021

(30) Foreign Application Priority Data

Jul. 31, 2019  (CN) .......................... 201910700450.4

(51) Int. Cl.
*G03F 1/36*    (2012.01)
*G03F 7/00*    (2006.01)
(Continued)

(52) U.S. Cl.
CPC .................. *G03F 1/36* (2013.01); *G03F 1/00* (2013.01); *G03F 7/0007* (2013.01); *G03F 7/16* (2013.01);
(Continued)

(58) Field of Classification Search
CPC . G03F 1/36; G03F 1/00; G03F 7/0007; G03F 7/16; G03F 7/20; G03F 7/26; H01L 27/3246; H01L 51/0018; H01L 51/5284
See application file for complete search history.

(56) References Cited

U.S. PATENT DOCUMENTS

| | | |
|---|---|---|
| 5,707,765 A | 1/1998 | Chen |
| 6,214,494 B1 | 4/2001 | Bula et al. |

(Continued)

FOREIGN PATENT DOCUMENTS

| | | | |
|---|---|---|---|
| CN | 101261441 A | | 9/2008 |
| CN | 101750871 A | * | 6/2010 |

(Continued)

OTHER PUBLICATIONS

English machine translation of CN-101750871-A (Jun. 2010) (Year: 2010).*

(Continued)

*Primary Examiner* — Peter L Vajda
*Assistant Examiner* — Jayson D Cosgrove
(74) *Attorney, Agent, or Firm* — Procopio, Cory, Hargreaves & Savitch LLP

(57) ABSTRACT

A mask includes a first light-transmitting portion. The first light-transmitting portion includes a target region and at least one compensation region connected to the target region. A planar pattern of the target region includes a plurality of corners, and a planar pattern of each compensation region extends from one of the plurality of corners.

(Continued)

An area of the planar pattern of each compensation region is less than an area of the planar pattern of the target region.

18 Claims, 10 Drawing Sheets

(51) Int. Cl.
| | |
|---|---|
| *G03F 7/16* | (2006.01) |
| *G03F 7/20* | (2006.01) |
| *G03F 7/26* | (2006.01) |
| *G03F 1/00* | (2012.01) |
| *H10K 50/86* | (2023.01) |
| *H10K 59/122* | (2023.01) |
| *H10K 71/20* | (2023.01) |

(52) U.S. Cl.
CPC .................. *G03F 7/20* (2013.01); *G03F 7/26* (2013.01); *H10K 50/865* (2023.02); *H10K 59/122* (2023.02); *H10K 71/233* (2023.02)

(56) References Cited

U.S. PATENT DOCUMENTS

| | | | |
|---|---|---|---|
| 2005/0121628 A1* | 6/2005 | Aoyama | .................. G03F 1/36 250/492.1 |
| 2016/0124262 A1* | 5/2016 | Wu | .................. G02F 1/133502 349/110 |
| 2019/0033702 A1 | 1/2019 | Zhang et al. | |
| 2019/0278181 A1* | 9/2019 | Deng | .................. H01L 27/1262 |
| 2020/0194464 A1* | 6/2020 | Xiao | .................. H01L 27/1288 |

FOREIGN PATENT DOCUMENTS

| | | |
|---|---|---|
| CN | 107479331 A | 12/2017 |
| CN | 109725486 A | 5/2019 |

OTHER PUBLICATIONS

Office Action dated May 25, 2023, in Chinese Patent Application No. 201910700450.4.

* cited by examiner

MASK AND METHOD FOR MANUFACTURING THE SAME, EXPOSURE SYSTEM, METHOD FOR MANUFACTURING A DISPLAY SUBSTRATE, AND DISPLAY DEVICE

CROSS-REFERENCE TO RELATED APPLICATION

This application claims priority to Chinese Patent Application No. 201910700450.4, filed on Jul. 31, 2019, which is incorporated herein by reference in its entirety.

TECHNICAL FIELD

The present disclosure relates to the field of display technologies, and in particular, to a mask and a method for manufacturing the same, an exposure system, a method for manufacturing a display substrate, and a display device.

BACKGROUND

A display panel includes a plurality of structures with patterns that are arranged in a stack, such as a black matrix (BM) layer, a pixel defining layer, a photo spacer (PS) layer, an insulating layer with via holes, wires, and electrodes. Manufacturing processes of these structures include mask exposure, development and other processes.

SUMMARY

In a first aspect, embodiments of the present disclosure provide a mask including a first light-transmitting portion. The first light-transmitting portion includes a target region and at least one compensation region connected to the target region. A planar pattern of the target region includes a plurality of corners, and a planar pattern of each compensation region extends from one of the plurality of corners. An area of the planar pattern of each compensation region is less than an area of the planar pattern of the target region.

In some embodiments, a shape of the planar pattern of the target region includes any one of the following shapes: a triangle, a rectangle, a trapezoid, a rhombus, a pentagon, or a hexagon.

In some embodiments, the at least one compensation region includes a plurality of compensation regions in one-to-one correspondence with the plurality of corners.

In some embodiments, planar patterns of the plurality of compensation regions are the same.

In some embodiments, a planar pattern of any compensation region is connected to one side or two sides of a corresponding corner.

In some embodiments, in a case where a planar pattern of any compensation region is connected to one side of a corresponding corner, a shape of the planar pattern of the compensation region includes any one of the following shapes: a triangle, a rectangle, a trapezoid, or a rhombus.

In some embodiments, a shape of the planar pattern of the target region includes a rectangle with each side length of $L_0$. The shape of the planar pattern of the compensation region includes a rectangle with each side length of $L_1$. A ratio of $L_0$ to $L_1$ is 5:2.

In some embodiments, in a case where a planar pattern of any compensation region is connected to two sides of a corresponding corner, a shape of a combined pattern composed of the planar pattern of the compensation region and the corresponding corner includes any one of the following shapes: a triangle, a rectangle, a trapezoid, a rhombus, a circle, or an ellipse.

In some embodiments, a shape of the planar pattern of the target region includes a rectangle with each side length of $L_0$. The shape of the combined pattern includes a rectangle with each side length of $L_1$ or a circle with a diameter of $L_1$. A ratio of $L_0$ to $L_1$ is 5:2.

In some embodiments, the first light-transmitting portion is a first opening portion.

In some embodiments, the mask further includes a second light-transmitting portion spaced apart from the first light-transmitting portion. An area of a planar pattern of a second light-transmitting portion is greater than an area of a planar pattern of the first light-transmitting portion.

In some embodiments, the second light-transmitting portion is a second opening portion.

In a second aspect, embodiments of the present disclosure further provide a method for manufacturing the mask described above. The method includes: providing a substrate; and forming a first light-transmitting portion in the substrate. The first light-transmitting portion includes a target region and at least one compensation region connected to the target region. A planar pattern of the target region includes a plurality of corners, and a planar pattern of each compensation region extends from one of the plurality of corners. An area of the planar pattern of each compensation region is less than an area of the planar pattern of the target region.

In some embodiments, before forming the first light-transmitting portion in the substrate, the method further includes: obtaining a compensation size of the planar pattern of each compensation region to be formed. Correspondingly, forming the first light-transmitting portion in the substrate includes: forming the target region and the at least one compensation region connected to the target region according to the compensation size.

In some embodiments, obtaining the compensation size of the planar pattern of each compensation region to be formed includes the following steps:

obtaining a test target region having a same planar pattern as the target region to be formed, wherein the planar pattern of the test target region is a test target pattern including a plurality of corners;

exposing a test photoresist layer by using the test target region, and developing the exposed test photoresist layer to form a test photoresist opening portion corresponding to the test target region, wherein a planar pattern of the test photoresist opening portion is a test opening pattern;

obtaining a difference value between a size of the test target pattern and a size of the test opening pattern at any one of the plurality of corners of the test target pattern;

obtaining a test mask light-transmitting portion, wherein the test mask light-transmitting portion includes: the test target region and at least one test compensation region connected to the test target region, a planar pattern of each test compensation region extending from one corner of the plurality of corners;

obtaining a plurality of reference sizes related to a test compensation region corresponding to the corner according to the difference value between the sizes;

sequentially selecting one reference size from the plurality of reference sizes as a size of the planar pattern of the test compensation region;

obtaining different difference values between a light transmittance of test exposure light passing through a portion of the test target region corresponding to the corner and a light transmittance of the test exposure light passing through a center of the test target region under a same test illumination condition;

obtaining a reference size corresponding to a minimum value in the different difference values; and taking the reference size as a compensation size of a planar pattern of a compensation region to be formed corresponding to the corner.

In some embodiments, the method further includes: forming a second light-transmitting portion spaced apart from the first light-transmitting portion in the substrate. An area of a planar pattern of the second light-transmitting portion is greater than an area of a planar pattern of the first light-transmitting portion.

In a third aspect, embodiments of the present disclosure further provide an exposure system including the mask described above and a light source configured to provide exposure light.

In a fourth aspect, embodiments of the present disclosure further provide a method for manufacturing a display substrate. The method includes: forming a photoresist layer on a base; exposing the photoresist layer by using the mask; and developing the exposed photoresist layer to form a photoresist pattern.

In a fifth aspect, embodiments of the present disclosure further provide a display device including a display substrate obtained by using the method described above.

In some embodiments, the photoresist pattern in the display substrate includes a black matrix layer or a pixel defining layer.

BRIEF DESCRIPTION OF THE DRAWINGS

In order to explain technical solutions in the embodiments of the present disclosure more clearly, the accompanying drawings used in some embodiments of the present disclosure will be introduced briefly. However, the accompanying drawings to be described below show some illustrative embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals that the embodiments of the present disclosure relate to.

DETAILED DESCRIPTION

Figure 1A:
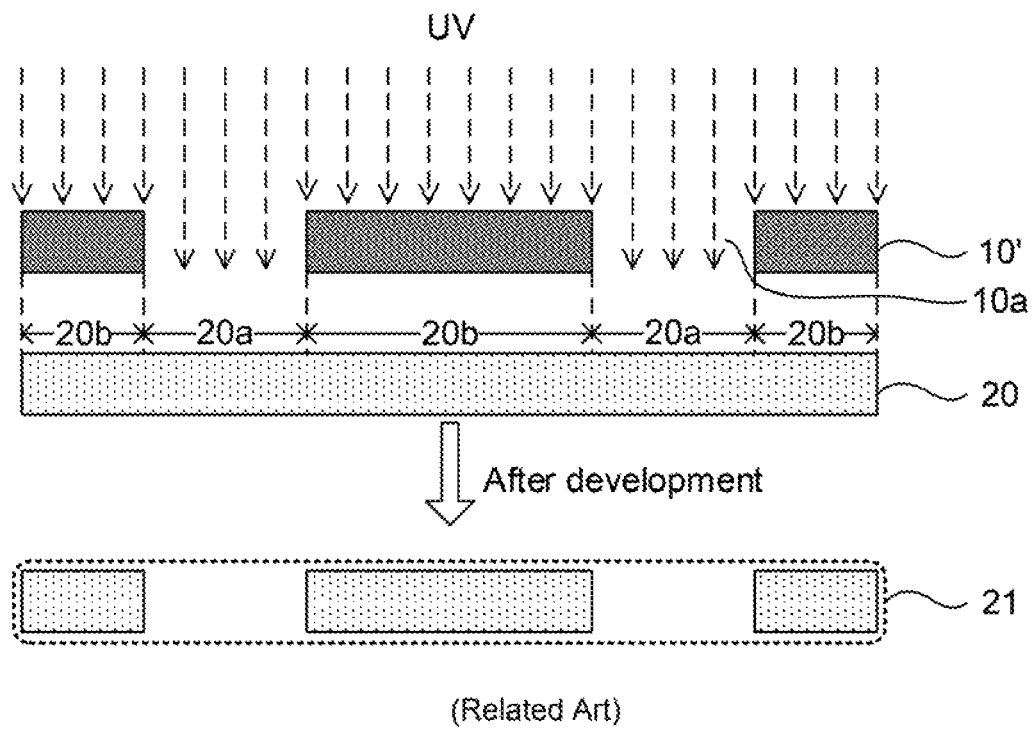
FIG. 1A is a schematic diagram showing an exposure process in the related art.

Technical solutions in some embodiments of the present disclosure will be described clearly and completely with reference to accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, in the entire description and the claims, the term "comprise/include" and other forms thereof such as the third-person singular form "comprises/includes" and the present participle form "comprising/including" in the description and the claims are construed as open and inclusive, i.e., "inclusive, but not limited to". In the description, the terms such as "one embodiment", "some embodiments", "exemplary embodiments", "example", "some examples", or "specific example" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In addition, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

Furthermore, the phrase "at least one of A, B, and C" has a same meaning as the phrase "at least one of A, B, or C", and both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

In the description and the claims, the use of the term "applicable to" or "configured to" means an open and inclusive language that does not exclude devices that are applicable to or configured to perform additional tasks or steps.

As used in the description, the term "about", "approximately" or "substantially" is inclusive of a stated value and an average value within an acceptable deviation range for a specific value. The acceptable deviation range as used herein is determined by a person of ordinary skill in the art, considering the measurement in question and the error associated with measurement of the particular quantity (i.e., the limitations of a measurement system).

Moreover, exemplary embodiments are described in the description with reference to cross-sectional views and/or plan views as idealized exemplary drawings. In the accompanying drawings, thicknesses of layers and regions are enlarged for clarity.

Figure 1B:
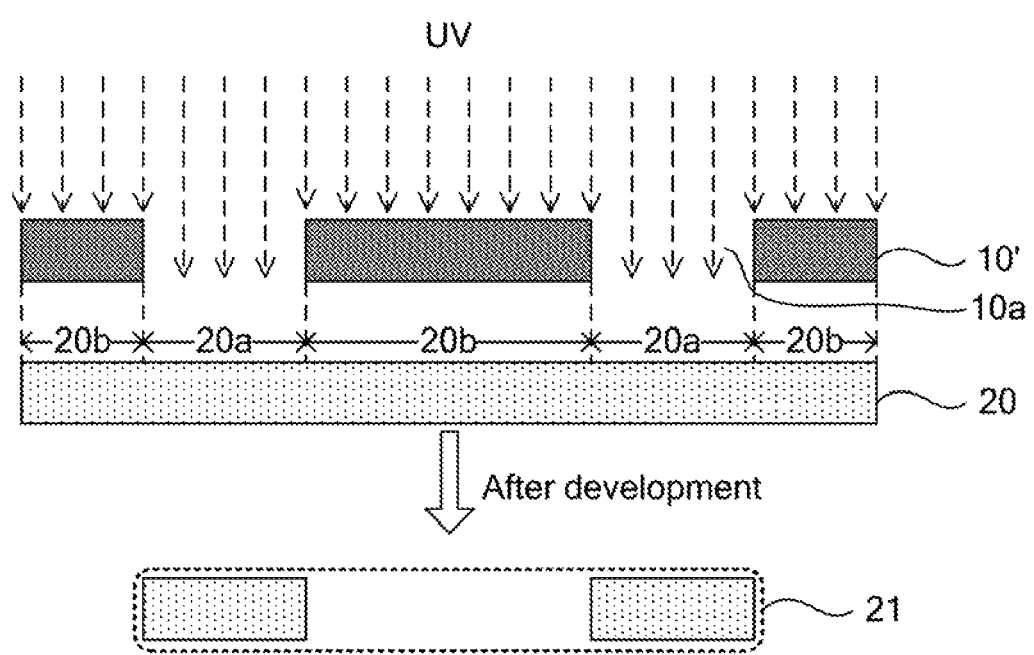
FIG. 1B is a schematic diagram showing another exposure process in the related art.

FIG. 1A is a schematic diagram showing an exposure process in the related art, and FIG. 1B is a schematic diagram showing another exposure process in the related art.

As shown in FIGS. 1A and 1B, exposure light (e.g., ultraviolet (UV) light) pass through light-transmitting portions (e.g., opening portions) 10a of a mask 10', and is irradiated onto a photoresist layer 20 to expose the photoresist layer 20, such that exposed portions 20a and unexposed portions 20b of the photoresist layer 20 have different material properties. After that, the exposed photoresist layer 20 is treated with a developing solution, so that portions of the photoresist layer 20 are removed, thereby obtaining a photoresist pattern 21.

In a case where the photoresist layer 20 is made of a positive photoresist, since the positive photoresist cannot be dissolved by a developing solution in a case where the positive photoresist is not exposed, as shown in FIG. 1A, after the photoresist layer 20 is exposed by the UV light, the exposed portions 20a are subjected to a photodissolution reaction, and is capable to be dissolved by the developing solution. So that, the exposed portions 20a may be removed. By contrast, material properties of the unexposed portions 20b do not change, that is, the unexposed portions 20b are not subjected to the photodissolution reaction. Thus, the unexposed portions 20b cannot be dissolved by the developing solution, and then are retained.

An exposed portion 20a of the photoresist layer 20 has a same planar pattern (i.e., a same shape and a same area) or substantially the same planar pattern (i.e., substantially the same shape and substantially the same area) as a corresponding light-transmitting portion 10a of the mask 10'. Therefore, after the exposed portions 20a in the photoresist layer 20 are removed, the formed photoresist pattern 21 has a planar pattern that is complementary or substantially complementary to a whole planar pattern of the light-transmitting portions 10a.

In a case where the photoresist layer 20 is made of a negative photoresist, since the negative photoresist has material properties that are opposite to material properties of the positive photoresist, that is, the negative photoresist is capable to be dissolved by a developing solution in a case where the negative photoresist is not exposed, as shown in FIG. 1B, after the photoresist layer 20 is exposed by the UV light, the exposed portions 20a are subjected to a cross-linking curing reaction, and cannot be dissolved by the developing solution. So that, the exposed portions 20a are retained. By contrast, material properties of the unexposed portions 20b do not change, that is, the unexposed portions 20b are not subjected to the cross-linking curing reaction. Thus, the unexposed portions 20b may be dissolved by the developing solution, and then are removed.

The exposed portion 20a of the photoresist layer 20 has the same planar pattern (i.e., the same shape and the same area) or substantially the same planar pattern (i.e., substantially the same shape and substantially the same area) as the corresponding light-transmitting portion 10a of the mask 10'. Therefore, after the exposed portions 20a in the photoresist layer 20 are retained, the formed photoresist pattern 21 has a planar pattern that is the same or substantially the same as a whole planar pattern of the light-transmitting portions 10a.

It will be noted that, in the description that the exposed portion 20a of the photoresist layer 20 has the same planar pattern (i.e., the same shape and the same area) or substantially the same planar pattern (i.e., substantially the same shape and substantially the same area) as the corresponding light-transmitting portion 10a of the mask 10', the term "corresponding" generally refers to a perpendicular correspondence. That is, in a thickness direction of the photoresist layer 20, a light-transmitting portion 10a in the mask 10' perpendicularly (or substantially perpendicularly) corresponds to an exposed portion 20a in the photoresist layer 20.

Moreover, it will be understood that, in the description of the above exposure processes and in the description of subsequent embodiments, when a "planar pattern" of a structure is described, the term "planar pattern" refers to a pattern of an orthographic projection of the structure on a plane. The plane may be a surface of an object in contact with the structure, or a surface of an object not in contact with the structure, or an imaginary plane. In addition, when "planar patterns" of two or more structures are described, a same plane is usually used as a reference object.

When a "planar pattern" of a region is described, the term "planar pattern" refers to a pattern enclosed by a boundary of the region.

For example, taking the exposed portion 20a of the photoresist layer 20 and the corresponding light-transmitting portion 10a of the mask 10' as an example, the photoresist layer 20 usually covers a surface of a base, and an orthographic projection of the exposed portion 20a on the surface of the base is the planar pattern of the exposed portion 20a. Correspondingly, an orthographic projection of the light-transmitting portion 10a on the surface of the base is the planar pattern of the light-transmitting portion 10a.

In some examples, the photoresist pattern formed after exposure, development and other processes is directly used as a structure in a display panel. For example, in the display panel, at least one of a black matrix (BM) layer, a pixel defining layer, a photo spacer (PS) layer, or an insulating layer with via holes is the photoresist pattern.

In some other examples, before the photoresist pattern is formed, the photoresist layer covers a surface of a film layer (i.e., a layered structure including a single film or a plurality of films). After the photoresist pattern is formed, partial regions of the surface of the film layer are exposed by the photoresist pattern. In this way, taking the photoresist pattern as a mask, portions in the partial regions in the film layer are removed through, for example, an etching process, thereby forming a pattern that is the same or substantially the same as the photoresist pattern, such as a pattern of wires or a pattern of electrodes.

In the related art, an exposure machine is needed in a process of exposing the photoresist layer. Since an area of the photoresist layer used in a process of manufacturing a display motherboard (i.e., a whole panel suitable for forming a plurality of display panels after being cut) is usually very large, the exposure machine includes a plurality of light sources for generating the exposure light (e.g., the UV light), for example, a plurality of light-emitting diodes (LED) lamps arranged in sequence. Due to the large number of the light sources, it is difficult that structures and mounting positions of the light sources are completely the same. Therefore, it is difficult that light emitted by the light sources is completely parallel with each other. Moreover, the light emitted by each light source also has a certain diffraction effect.

As a result, in a case where a size of the planar pattern of the light-transmitting portion of the mask is small, for example, a mask for manufacturing a small-sized display panel (e.g., a mobile display terminal such as a mobile phone), in the process of exposing the photoresist layer by using the mask, there is a significant difference in light transmittances of different regions of the light-transmitting portion with a small size. For example, in a same light-transmitting portion, a light transmittance of corner regions is less than a light transmittance of a remaining region. That is, amounts of light passing through the corner regions of the light-transmitting portion are insufficient. Therefore, a phenomenon of insufficient exposures occurs in portions of the photoresist layer corresponding to the corner regions of the light-transmitting portion, which causes that there is significant difference between an actual photoresist pattern formed after exposure, development and other processes and a preset photoresist pattern (also referred to as a target photoresist pattern), thereby reducing a yield of the display panel.

Figure 2:
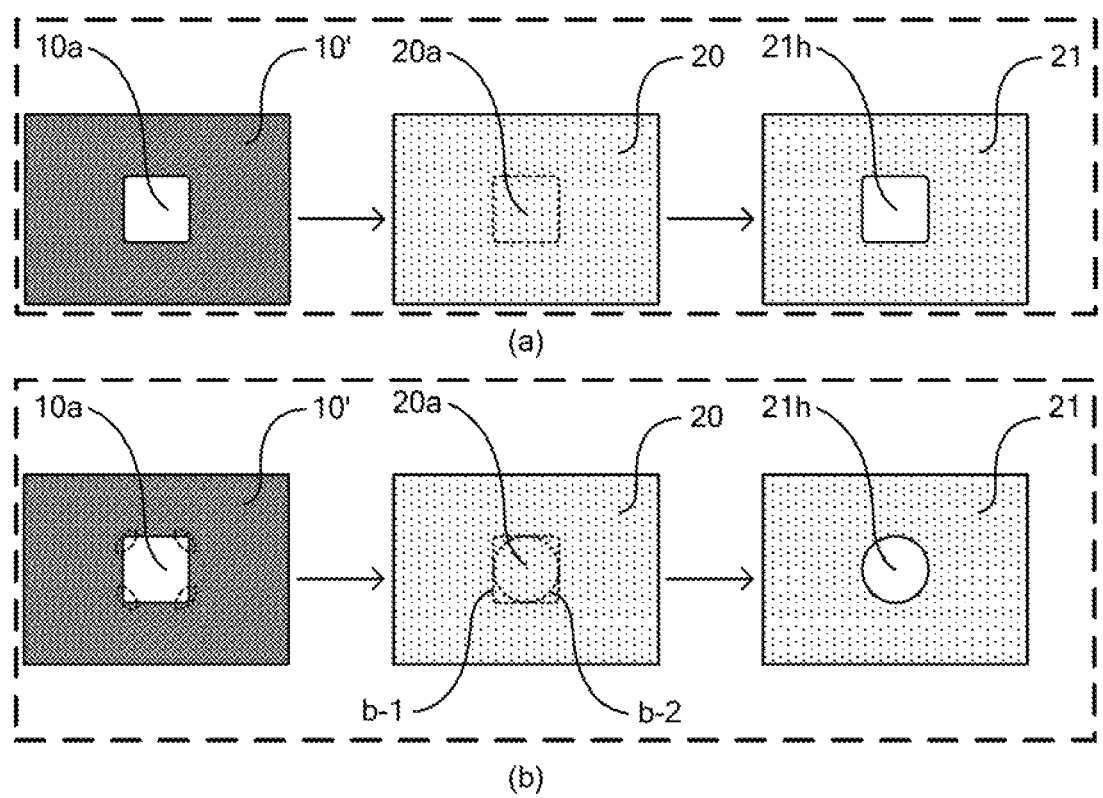
FIG. 2 is a schematic diagram showing a comparison between a process of forming a photoresist pattern in an ideal state and a process of forming a photoresist pattern in an actual state.

Taking an example in which the photoresist layer 20 is made of the positive photoresist, FIG. 2 is a schematic diagram showing a comparison between a process of forming a photoresist pattern in an ideal state and a process of forming a photoresist pattern in an actual state.

As shown in FIG. 2, the planar pattern of the light-transmitting portion 10a of the mask 10' is a rounded pattern, for example, a rounded rectangle.

It will be noted herein that, in the related art, in the case where the size of the planar pattern of the light-transmitting portion 10a of the mask 10' is small, due to a limited accuracy of a manufacturing process of the mask 10', it is difficult to form an ideal pattern with sharp corners, such as a triangle, a rectangle, a trapezoid, a rhombus, a pentagon, or a hexagon. Therefore, the planar pattern of the light-transmitting portion 10a of the formed mask 10' is usually a pattern with rounded corners, such as a rounded triangle, a rounded rectangle, a rounded trapezoid, a rounded rhombus, a rounded pentagon, or a rounded hexagon, that is, a pattern formed after each sharp corner in the ideal pattern is replaced with a circular arc that is tangent to both sides of the sharp corner (e.g., a right angle in a rectangle).

After the photoresist layer 20 is exposed by using the mask 10' and the exposed photoresist layer 20 is developed, a photoresist pattern 21 having an opening 21h is formed. In the ideal state, as shown in part (a) in FIG. 2, the light transmittances of different regions of the light-transmitting portion 10a of the mask 10' are equal or substantially equal. Therefore, exposures in different regions of the exposed portion 20a (shown by the dashed box) of the photoresist layer 20 are also equal or substantially equal.

In this way, a planar pattern of the formed opening 21h is the same or substantially the same as the planar pattern of the light-transmitting portion 10a. In a case where a shape of the planar pattern of the light-transmitting portion 10a is a rounded rectangle, the formed opening 21h may also be referred to as a square hole.

However, in the actual state, as shown in part (b) in FIG. 2, the light transmittance of the corner regions (shown by the dashed boxes) of the light-transmitting portion 10a of the mask 10' is significantly less than the light transmittance of the remaining region. That is, an amount of the UV light reaching the photoresist layer 20 through the corner regions is significantly insufficient. Therefore, exposures in regions in the exposed portion 20a (shown by dashed box b-1) of the photoresist layer 20 corresponding to the corner regions of the light-transmitting portion 10a are significantly less than an exposure in a remaining region of the exposed portion 20a.

The exposures in the regions in the exposed portion 20a of the photoresist layer 20 corresponding to the corner regions of the light-transmitting portion 10a are significantly less than the exposure in the remaining region, and a development accuracy of the photoresist (also referred to as an etching accuracy) is limited, and material properties of regions where exposures are very small in the exposed portion 20a are hard to change in the developing solution. Therefore, in a process of developing the exposed photoresist layer 20, the regions in the exposed portion 20a corresponding to the corner regions of the light-transmitting portion 10a are difficult to be dissolved by the developing solution.

That is to say, in a case where the shape of the planar pattern of the light-transmitting portion 10a is a rounded rectangle, and lengths of four sides of the rectangle are equal, a shape of a planar pattern of an effective portion in the exposed portion 20a that is capable to actually be dissolved by the developing solution is a circle or an approximate circle (shown by dashed box b-2). In a case where the shape of the planar pattern of the light-transmitting portion 10a is a rounded rectangle, and lengths of two sides of the rectangle are not equal to lengths of the other two sides, a shape of a planar pattern of an effective portion in the exposed portion 20a that is capable to actually be dissolved by the developing solution is an ellipse or an approximate ellipse.

As a result, the planar pattern of the formed opening 21h is significantly different from the planar pattern of the light-transmitting portion 10a, and a shape of the planar pattern of the formed opening 21h is a circle (in the case where the lengths of the four sides of the rounded rectangle are equal) or an ellipse (in the case where the lengths of the two sides of the rounded rectangle are not equal to the lengths of the other two sides). That is, the formed opening 21h may also be referred to as a round hole.

Obviously, as shown in FIG. 2, there is a great difference between the planar pattern of the opening 21h in the photoresist pattern 21 in the ideal state and the planar pattern of the opening 21h in the photoresist pattern 21 in the actual state, which causes a great difference between an actual size of the opening 21h of the photoresist pattern 21 and a preset size thereof, or a great difference between an actual size of a structure manufactured by using the photoresist pattern 21 in the display panel and a preset size thereof, thereby affecting the yield of the display panel.

Figure 3:
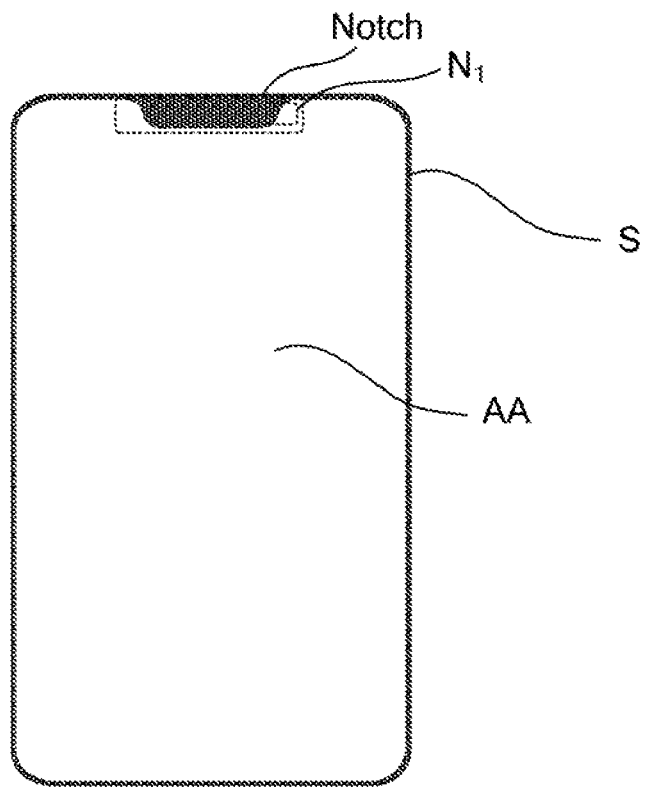
FIG. 3 is a schematic diagram showing a structure of a display panel in the related art.

FIG. 3 is a schematic diagram showing a structure of a display panel in the related art. As shown in FIG. 3, a display area AA of the display panel has a notch region. Correspondingly, a peripheral region S outside the display area AA has a convex region complementary to the notch region. A display panel having a notch region is also referred to as a "Bangs screen".

In the related art, the display panel includes structures such as wires, chips, and sensors that are disposed in the peripheral region S, and a light-shielding layer for shielding these structures, so that an appearance of the display panel is good. The light-shielding layer is usually black, so that the peripheral region S of the display panel seen by human eyes is black. In some examples, the light-shielding layer is an independent structure, such as a cover plate that is transparent in middle and black in periphery. In some other examples, in the display panel, a black matrix or a pixel defining layer used to define a plurality of sub-pixels includes a portion extending to the peripheral area, and the portion is used as the light-shielding layer.

Figure 4:
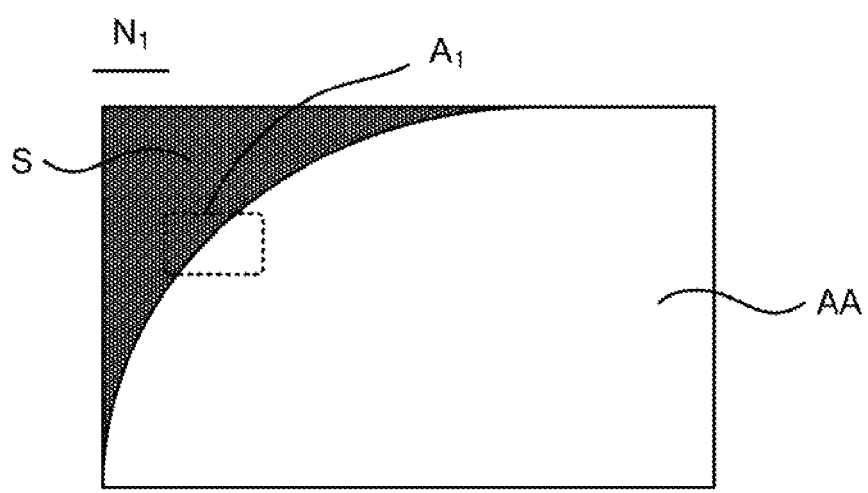
FIG. 4 is an enlarged schematic diagram of a portion shown by dashed box $N_1$ in FIG. 3.
Figure 5A:
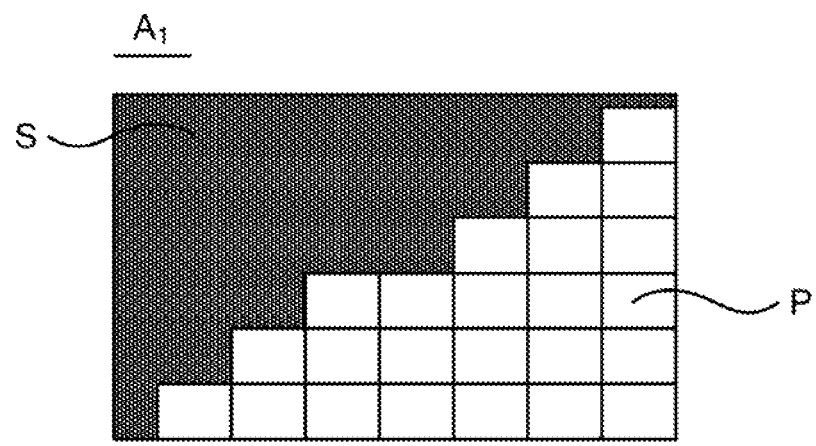
FIG. 5A is an enlarged schematic diagram of a portion shown by dashed box $A_1$ in FIG. 4.

FIG. 4 is an enlarged schematic diagram of a portion shown by dashed box $N_1$ in FIG. 3, and FIG. 5A is an enlarged schematic diagram of a portion shown by dashed box $A_1$ in FIG. 4. As shown in FIGS. 4 and 5A, a portion of a boundary of the display area AA connected to the convex region in the peripheral region S is curved. At this curved position, a plurality of rows of sub-pixels P in the display panel are usually arranged in a step-like manner. That is, a portion of a row of sub-pixels proximate to the curved position are more or less than a portion of an adjacent row of sub-pixels proximate to the curved position by a certain number of sub-pixels, so that a curved visual effect may be macroscopically presented at the curved position of the display area AA.

However, when the display panel displays an image (e.g., an image including a solid color portion such as a white portion), since the convex region in the peripheral region S seen by the human eyes is usually black, a bright-dark contrast between white sub-pixels proximate to the convex region and the convex region is very strong, such that there is an obvious sawtooth feeling at an edge of the notch region may be seen by the human eyes, thereby affecting a contrast and a quality of the image.

Figure 5B:
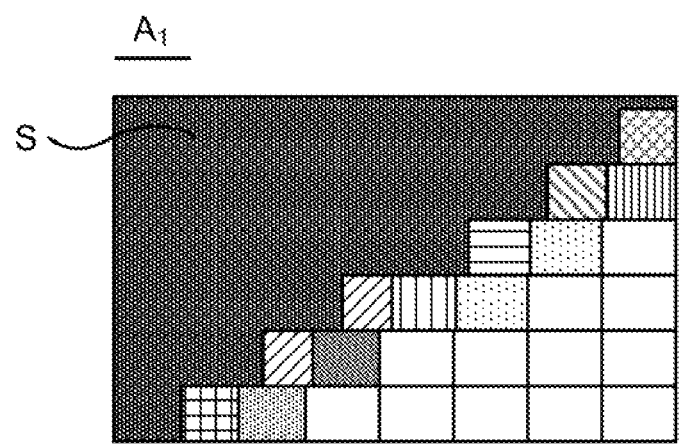
FIG. 5B is another enlarged schematic diagram of a portion shown by dashed box $A_1$ in FIG. 4.
Figure 5B:
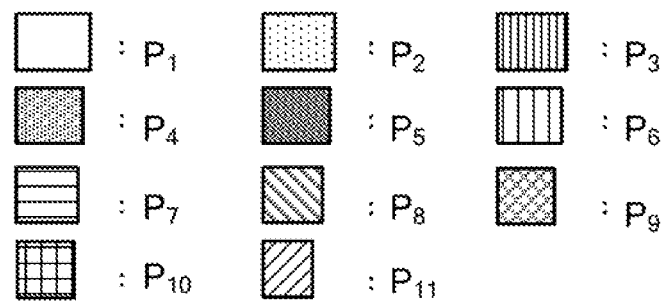

In order to solve this problem, a display panel is provided in the related art. FIG. 5B is another enlarged schematic diagram of a portion shown by dashed box $A_1$ in FIG. 4. As shown in FIG. 5B, in the display panel, effective display areas of the plurality of sub-pixels at the curved position are not completely the same. In each row of sub-pixels, sub-pixels that are closer to the curve position have smaller effective display areas, and sub-pixels that are further away from the curve position have larger effective display areas. In this way, when the display panel displays a white image, the sawtooth feeling of the image at the edge of the notch region may be weakened.

Herein, the phrase "effective display area" refers to an area actually used for display in each sub-pixel. For example, in a liquid crystal display (LCD) panel, the phrase "effective display area" refers to a light-transmitting area of each sub-pixel, and the area usually depends on an area of an opening of a BM layer in the display panel. In an organic light-emitting diode (OLED) display panel, the phrase "effective display area" refers to a light-emitting area of each sub-pixel, and the area usually depends on an area of an opening of a pixel defining layer in the display panel.

The effective display area of the sub-pixel affects a maximum gray scale that the sub-pixel is capable to display. For example, as shown in FIG. 5A, the effective display areas of the plurality of sub-pixels P at the curved position are equal or substantially equal, and the maximum gray scale that each sub-pixel P is capable to display is 255. Therefore, a bright-dark contrast between the notch region of the display area AA and the peripheral region S (where the gray scale is zero) is very strong.

In contrast, as shown in FIG. 5B, in the plurality of sub-pixels at the curved position, effective display areas of sub-pixels $P_1$, $P_2$, $P_3$, $P_4$, $P_5$, $P_6$, $P_7$, $P_8$, $P_9$, $P_{10}$ and $P_{11}$ decrease in sequence, and maximum gray scales that these sub-pixels are capable to display are respectively 255, 252, 246, 220, 198, 182, 153, 120, 99, 79, and 48. That is to say, by adjusting the effective display areas of the plurality of sub-pixels at the curved position, the maximum gray scales of these sub-pixels are progressively changed, so as to reduce the bright-dark contrast between the notch region of the display area AA and the peripheral region S.

According to different sizes and different resolutions of the display panel, in the plurality of sub-pixels at the curved position, effective display areas of sub-pixels with small sizes are also different. Generally, the effective display area of the sub-pixel $P_{11}$ corresponding to gray scale 48 is usually within a range from 10 μm×10 μm to 30 μm×30 μm, inclusive.

In this way, an area of an opening in the BM layer or the pixel defining layer corresponding to the sub-pixel $P_{11}$ is also small. It will be seen from the foregoing description of the mask exposure process that, as for the sub-pixels with small sizes, due to an accuracy of the exposure machine, the diffraction effect of light, etching limitation of the photoresist and limitation of a wet etching process, an actually formed pattern is different from a preset pattern (also referred to as a target pattern).

For example, in a process of forming the BM layer or the pixel defining layer, an opening in the BM layer or the pixel defining layer corresponding to a position of a sub-pixel with a small size is also small. As a result, with reference to part (b) in FIG. 2, a designed shape of the opening in the BM layer or the pixel defining layer is a square hole shown in part (a) in FIG. 2. However, in an actual manufacturing process, a shape of a finally formed opening is a round hole shown in part (b) in FIG. 2. Therefore, an effective display area of the sub-pixel is reduced, that is, an aperture ratio of the sub-pixel is reduced, which causes that, when the display panel including the sub-pixel displays an image, a maximum gray scale that the sub-pixel is capable to display becomes small, and a required gray scale cannot be displayed, thereby affecting a contrast of the image, and making it difficult to weaken the sawtooth feeling at the edge of the notch region.

Figure 6:
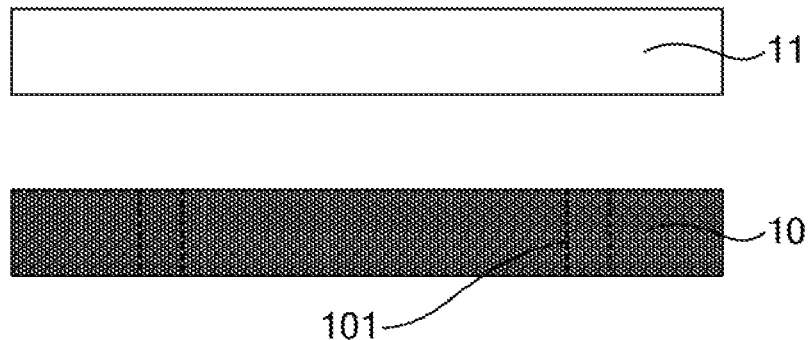
FIG. 6 is a schematic diagram showing a structure of an exposure system, according to some embodiments of the present disclosure.

On this basis, some embodiments of the present disclosure provide an exposure system 01. As shown in FIG. 6, the exposure system 01 includes a mask 10 and a light source 11 configured to provide exposure light.

In some examples, the light source 11 is a light-emitting diode (LED) light source to provide the UV light. In some other examples, the exposure system 01 includes a plurality of light sources 11, such as a plurality of LED light bars.

In some examples, the exposure system 01 further includes the following structures: a fixing member for supporting the mask 10, a base for placing a structure to be exposed (e.g., a photoresist layer), lens for improving collimation of light emitted by the light source 11 and other optical devices.

A structure of the mask 10 will be described in detail below.

Figure 7A:
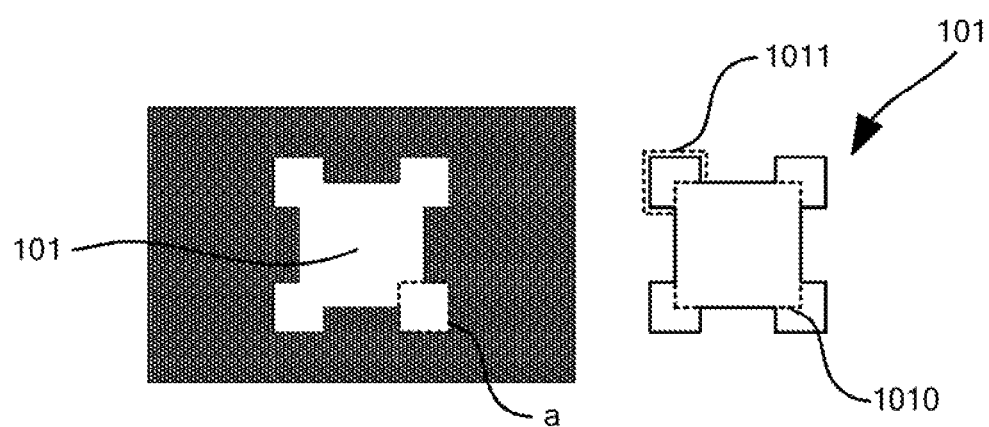
FIG. 7A is a schematic top view of a mask, according to some embodiments of the present disclosure.

Some embodiments of the present disclosure provide a mask 10. As shown in FIG. 7A, the mask 10 includes a first light-transmitting portion 101. The first light-transmitting portion 101 includes a target region 1010 and at least one compensation region 1011 connected to the target region 1010. A planar pattern of the target region 1010 includes a plurality of corners, and a planar pattern of each compensation region 1011 extends from one of the plurality of corners. An area of the planar pattern of each compensation region 1011 is less than an area of the planar pattern of the target region 1010.

For example, the first light-transmitting portion 101 is a first opening portion, that is, the first light-transmitting portion 101 is a through portion in the mask 10, i.e., an open region, so that the exposure light may be irradiated onto the photoresist layer through this region. Therefore, the first light-transmitting portion 101 may also be referred to as a first hollowed-out region.

Of course, in some examples, it is also allowable that the first light-transmitting portion 101 is a transparent block (i.e., a block structure formed of a transparent film layer).

Figure 7B:
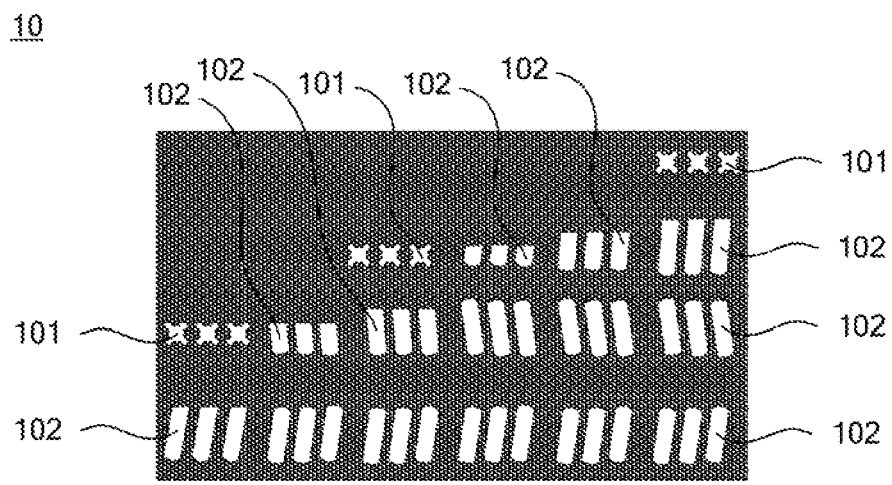
FIG. 7B is a schematic top view of another mask, according to some embodiments of the present disclosure.

The number of the first light-transmitting portion 101 in the mask 10 is not limited to one. In some examples, as shown in FIG. 7B, the mask 10 includes a plurality of first light-transmitting portions 101 that are spaced apart from each other. In this case, according to different photoresist patterns to be formed, in some examples, planar patterns of the first light-transmitting portions 101 are completely the same. In some other examples, the planar patterns of the first light-transmitting portions 101 are partially the same. In yet some other examples, the planar patterns of the first light-transmitting portions 101 are completely different, which is not limited in the embodiments of the present disclosure.

It will also be understood that, apart from the first light-transmitting portion 101, the mask 10 may further include other light-transmitting portion(s). That is, the mask 10 may be formed by forming a plurality of light-transmitting portions that are spaced apart from each other in a substrate.

It will be seen from the foregoing description that, when a "planar pattern" of a region is described, the term "planar pattern" refers to a pattern enclosed by a boundary of the region. That is, the planar pattern of the target region 1010 in the first light-transmitting portion 101 is a pattern enclosed by a boundary of the target region 1010. Similarly, the planar pattern of the compensation region 1011 in the first light-transmitting portion 101 is a pattern enclosed by a boundary of the compensation region 1011. In the first light-transmitting portion 101, the planar pattern of the target region (also referred to as a target hollowed-out region) 1010 plays a major role in the photoresist pattern to be formed, and the planar pattern of the compensation region (also referred to as a compensation hollowed-out region) 1011 plays a role of compensating the photoresist pattern to be formed. Therefore, the planar pattern of the target region 1010 is related to a photoresist pattern that needs to be formed after exposure by using the mask 10. A shape and a size of the target region 1010 may be designed according to a shape and a size of an opening of the photoresist pattern that needs to be formed.

For example, in a process of forming a BM layer or a pixel defining layer, the shape and the size of the target region 1010 may be designed according to a shape and a size of a corresponding opening in the BM layer or the pixel defining layer that needs to be formed.

The planar pattern of the target region 1010 includes a plurality of corners. That is to say, a shape of the planar pattern of the target region 1010 is a polygon. The polygon includes the rectangle shown in FIG. 7A or 7B, or another regular or irregular shape, such as a triangle shown by part (a), a trapezoid shown by part (b), a rhombus shown by part (c), a pentagon shown by part (d), or a hexagon shown by part (e) in FIG. 8.

Herein, in a case where the mask 10 includes the plurality of first light-transmitting portions 101, the planar patterns of the target regions 1010 in the first light-transmitting portions 101 may be completely the same, or partially the same, or completely different, which is not limited in the embodiments of the present disclosure.

As shown in FIGS. 7A and 7B, in a first light-transmitting portion 101, the planar pattern of each compensation region 1011 extends from one of the plurality of corners of the planar pattern of the target region 1010.

It will be understood that, as for any first light-transmitting portion 101, in some examples, each corner in the planar pattern of the target region 1010 is connected to a planar pattern of a compensation region 1011. In some other examples, several corners in the planar pattern of the target region 1010 are connected to planar patterns of corresponding compensation regions 1011, and remaining one or more corner(s) are not connected to the planar pattern of any compensation region 1011. In yet some other examples, a single corner in the planar pattern of the target region 1010 is connected to a planar pattern of a single compensation region 1011, and remaining corners are not connected to the planar pattern of any compensation region 1011.

It will be seen from the foregoing description that, with reference to part (b) in FIG. 2, in the related art, in a case where the light-transmitting portion 10a of the mask 10' only includes the target region, the light transmittance of the corner regions (shown by the dashed boxes) of the light-transmitting portion 10a of the mask 10' is significantly less than the light-transmitting portion of the remaining region. If a shape of the light-transmitting portion (i.e., the target region) 10a is a square hole, the shape of the opening 21h of the photoresist pattern 21 formed after exposure and development by using the mask 10' is a round hole. Thus, it is difficult to obtain a desired pattern.

In contrast, in the mask 10 provided by the embodiments of the present disclosure, apart from the target region 1010, the same first light-transmitting portion 101 further includes at least one compensation region 1011 connected to the target region 1010. In this way, after the exposure light passes through the first light-transmitting portion 101 of the mask 10, a part of the light passes through the at least one compensation region 1011. Therefore, the light passing through the at least one compensation region 1011 increases amount(s) of light passing through portion(s) of the target region 1010 corresponding to one or more corner(s). So that, the amount(s) of the light passing through the portion(s) of the target region 1010 corresponding to the corner(s) are the same or approximately the same as an amount of light passing through a remaining portion. That is to say, after the photoresist layer is exposed by using the mask 10, the light passing through the at least one compensation region 1011 may compensate exposures in portion(s) of the photoresist layer corresponding to the one or more corner(s). That is, the target region 1010 may be meliorated through the at least one compensation region 1011.

Since the planar pattern of each compensation region 1011 only extends from one corner of the planar pattern of the target region 1010, the light passing through the compensation region 1011 does not affect an amount of light passing through a portion of the target region 1010 except for the portions corresponding to the corners. Moreover, the area of the planar pattern of each compensation region 1011 is less than the area of the planar pattern of the target region 1010. Therefore, an amount of the light passing through the at least one compensation region 1011 does not increase much compared with an amount of light passing through the portion of the target region 1010 except for the portions corresponding to the corners. So that, a planar pattern of the opening in the formed photoresist pattern is the same or approximately the same as the planar pattern of the target region 1010. That is, the planar pattern of the opening in the formed photoresist pattern has a same shape and a same size or has approximately the same shape and approximately the same size as the planar pattern of the target region 1010.

In a case where the photoresist pattern is used as the BM layer or the pixel defining layer, openings with small sizes in the BM layer or in the pixel defining layer may reach sizes required by design. Further, aperture ratios of sub-pixels corresponding to the openings may reach ratios required by design, and a display requirement of progressively changing gray scales may be met, thereby weakening the sawtooth feeling of the displayed image at the edge of the notch region.

Moreover, by compensating the amount(s) of the light passing through the portion(s) of the target region 1010 corresponding to the one or more corner(s), an actual photoresist pattern having a very small difference from a preset photoresist pattern (i.e., a target photoresist pattern) may be obtained. That is to say, in a case where a shape of an opening in the preset photoresist pattern (i.e., the target photoresist pattern) is a square hole, a sharp corner of a planar pattern of an opening in the formed actual photoresist pattern may reach approximately 90°. That is, a shape of the planar pattern of the opening in the formed actual photoresist pattern is very approximate to a rectangle. Therefore, it is possible to avoid a problem that in the related art, in the case where the size of the planar pattern of the light-transmitting portion 10a of the mask 10' is small, due to the limited accuracy of the manufacturing process of the mask 10', it is difficult to form the ideal pattern with the sharp corners, and the formed planar pattern of the light-transmitting portion 10a of the mask 10' is usually the pattern with the rounded corners.

Considering that in the related art, in the case where the light-transmitting portion 10a of the mask 10' only includes the target region, the light passing through the light-transmitting portion 10a is diffracted in each corner region, which causes that an amount of light passing through each corner region is small. Therefore, in some embodiments of the present disclosure, each first light-transmitting portion 101 includes a plurality of compensation regions 1011 in one-to-one correspondence with the plurality of corners in the planar pattern of the target region 1010, so as to compensate the amount of the light passing through the portion of the target region 1010 corresponding to each corner.

On the above basis, there may be different manners in which the at least one compensation region 1011 is connected to the target region 1010. The amount of the light passing through the portion of the target region 1010 corresponding to each corner may be compensated in these manners.

Figure 9A:
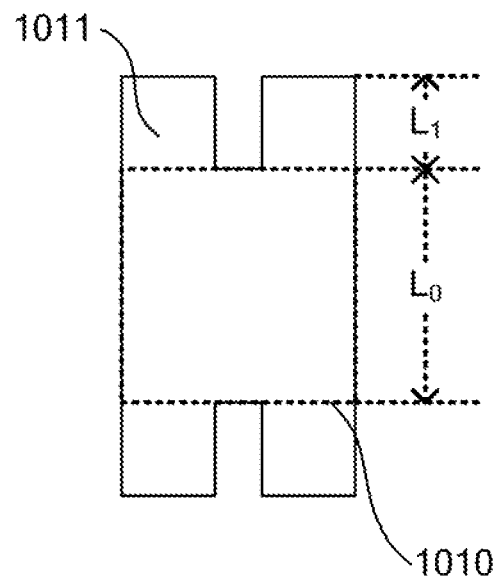
FIG. 9A is a schematic top view of a first light-transmitting portion in a mask, according to some embodiments of the present disclosure.

In some embodiments, as shown in FIG. 9A, in the same first light-transmitting portion 101, a planar pattern of any of the at least one compensation region 1011 is connected to one side of a corresponding corner in the planar pattern of the target region 1010.

In some other embodiments, as shown in FIGS. 7A, 7B, 9B, and 9C, in the same first light-transmitting portion 101, a planar pattern of any of the at least one compensation region 1011 is connected to two adjacent sides of a corresponding corner in the planar pattern of the target region 1010.

It will be understood that, in a case where the same first light-transmitting portion 101 includes a plurality of compensation regions 1011, there may also be different manners in which the planar pattern of each compensation region 1011 is connected to a corresponding corner.

For example, in the same first light-transmitting portion 101, the planar pattern of each compensation region 1011 is connected to one side of a corresponding corner. Or, the planar pattern of each compensation region 1011 is connected to two sides of a corresponding corner.

For another example, in the same first light-transmitting portion 101, the planar pattern of each of a part of the compensation regions 1011 is connected to one side of a corresponding corner, and, the planar pattern of each of the other part of the compensation regions 1011 is connected to two sides of a corresponding corner.

On the above basis, a planar pattern of any compensation region 1011 is not limited in the embodiments of the present disclosure, as long as after the compensation regions 1011 are provided at corresponding corners in the planar pattern of the target region 1010, a planar pattern of an actual exposure region of the photoresist layer exposed by using the mask 10 is the same or substantially the same as the planar pattern of the target region 1010, and exposures at different positions in the actual exposure region are the same or substantially the same.

Figure 8:
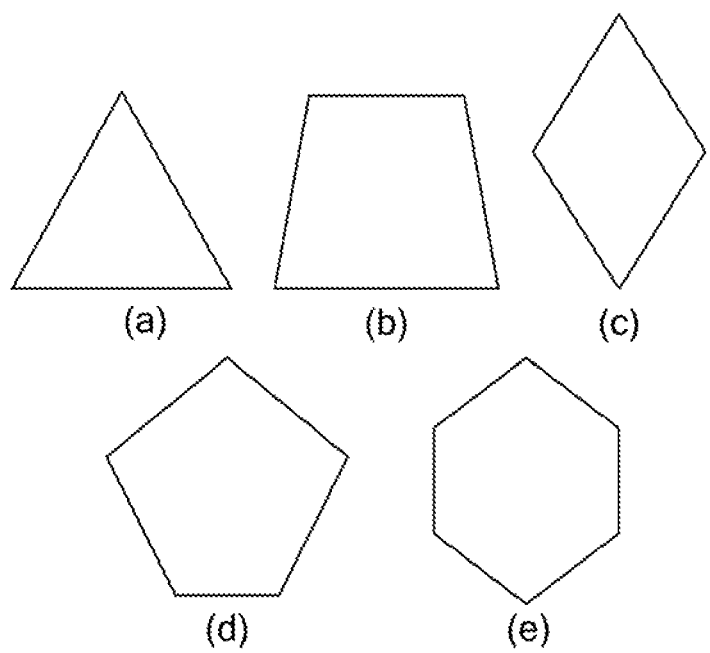
FIG. 8 is a schematic diagram showing different shapes of a planar pattern of a target region or a planar pattern of a compensation region or a combined pattern composed of a planar pattern of a compensation region and a corresponding corner in a mask, according to some embodiments of the present disclosure.

In some embodiments, in a case where a planar pattern of any compensation region 1011 is connected to one side of a corresponding corner, a shape of the planar pattern of the compensation region 1011 includes a rectangle shown in FIG. 9A, or another regular or irregular shape, such as a triangle shown by part (a), a trapezoid shown by part (b), a rhombus shown by part (c), a pentagon shown by part (d), or a hexagon shown by part (e) in FIG. 8.

For example, as shown in FIG. 9A, the shape of the planar pattern of the target region 1010 includes a rectangle with each side length of $L_0$ (i.e., a square), and the shape of the planar pattern of the compensation region 1011 includes a rectangle with each side length of $L_1$ (i.e., a square), so as to facilitate a calculation of the area of the planar pattern of the compensation region 1011, thereby facilitating a calculation of the amount (i.e., an increased exposure) of the light passing through the compensation region 1011. A ratio of $L_0$ to $L_1$ is 5:2 (i.e., $L_0:L_1=5:2$).

In this case, one side of the planar pattern of the compensation region 1011 overlaps with one side of the corner.

Figure 9B:
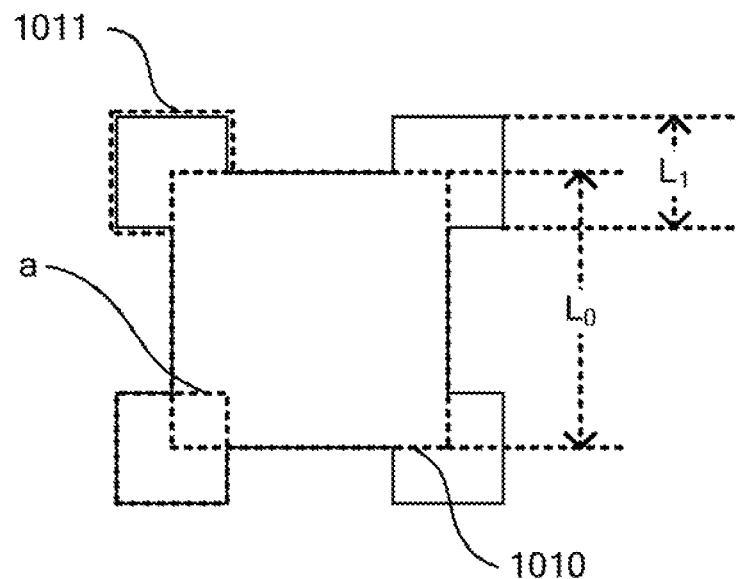
FIG. 9B is another schematic top view of a first light-transmitting portion in a mask, according to some embodiments of the present disclosure.
Figure 9C:
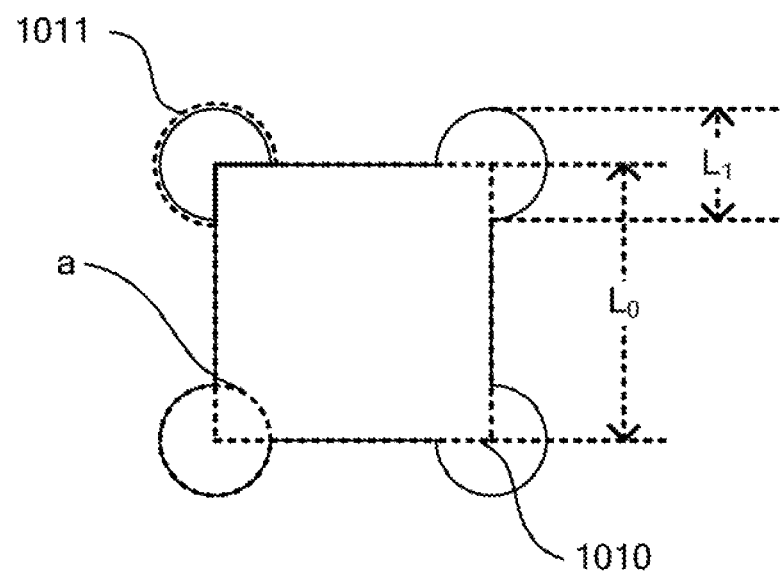
FIG. 9C is yet another schematic top view of a first light-transmitting portion in a mask, according to some embodiments of the present disclosure.

In some embodiments, in a case where a planar pattern of any compensation region 1011 is connected to two sides of a corresponding corner, a shape of a combined pattern composed of the planar pattern of the compensation region 1011 and the corresponding corner includes a rectangle shown in FIGS. 7A and 9B (shown by dashed box a), or a circle shown in FIG. 9C (shown by dashed box a), or another regular or irregular shape, such as an ellipse, a triangle shown by part (a), a trapezoid shown by part (b), a rhombus shown by part (c), a pentagon shown by part (d) or the hexagon shown by part (e) in FIG. 8.

For example, as shown in FIG. 9B or 9C, the shape of the planar pattern of the target region 1010 includes a rectangle with each side length of $L_0$ (i.e., a square), and the shape of the combined pattern includes a rectangle with each side length of $L_1$ (i.e., a square) or a circle with a diameter of $L_1$, so as to facilitate the calculation of the area of the planar pattern of the compensation region 1011, thereby facilitating the calculation of the amount (i.e., the increased exposure) of the light passing through the compensation region 1011. A ratio of $L_0$ to $L_1$ is 5:2 (i.e., $L_0:L_1=5:2$).

In a case where the shape of the combined pattern includes a rectangle with each side length of $L_1$, as shown in FIG. 9B, each side in the planar pattern of the target region 1010 is parallel or substantially parallel to a corresponding side in the combined pattern, and a center of the combined pattern coincides with a point of the corner of the planar pattern of the target region 1010, so as to uniformly compensate the amounts of the light passing through the portions of the target region 1010 corresponding to the four corners.

In a case where the shape of the combined pattern includes a circle with a diameter of $L_1$, as shown in FIG. 9C, the center of the combined pattern coincides with the point of the corner of the planar pattern of the target region 1010, so as to uniformly compensate the amounts of the light passing through the portions of the target region 1010 corresponding to the four corners.

Moreover, it will be understood that, in the plurality of compensation regions 1011 in the same first light-transmitting portion 101, it is allowable that the planar patterns of the compensation regions 1011 are completely the same, or partially the same, or completely different. Correspondingly, it is also allowable that the combined patterns composed of the planar patterns of the compensation regions 1011 and the corresponding corners are completely the same, or partially the same, or completely different.

On the above basis, as shown in FIG. 7B, the mask 10 further includes a second light-transmitting portion 102 spaced apart from the first light-transmitting portion 101. An area of a planar pattern of the second light-transmitting portion 102 is greater than the area of the planar pattern of the first light-transmitting portion 101.

For example, the second light-transmitting portion 102 is a second opening portion, that is, the second light-transmitting portion 102 is a through portion in the mask 10, i.e., an open region, so that the exposure light may be irradiated onto the photoresist layer through this region. Therefore, the second light-transmitting portion 102 may also be referred to as a second hollowed-out region.

Of course, in some examples, it is also allowable that the second light-transmitting portion 102 is a transparent block (i.e., a block structure formed of a transparent film layer).

Herein, the number of the second light-transmitting portion 102 in the mask 10 is not limited to one. In some examples, as shown in FIG. 7B, the mask 10 includes a plurality of second light-transmitting portions 102 that are spaced apart from each other. The planar patterns of the plurality of second light-transmitting portions 102 may be completely the same, or partially the same, or completely different, which is not limited. Moreover, an arrangement of the plurality of second light-transmitting portions 102 depends on corresponding openings in the photoresist pattern to be formed, which is not limited herein.

The area of the planar pattern of the second light-transmitting portion 102 is much greater than the area of the planar pattern of the first light-transmitting portion 101. A size of the second light-transmitting portion 102 is very large, and areas of corner regions of the second light-transmitting portion 102 are very small compared with an area of a remaining region. Therefore, an influence of the corner regions on an amount of light passing through the whole second light-transmitting portion 102 is also very small, and there is no need to provide any compensation region 1011 in the second light-transmitting portion 102.

On the above basis, some embodiments of the present disclosure provide a method for manufacturing the mask 10 according to the above embodiments.

Figure 10:
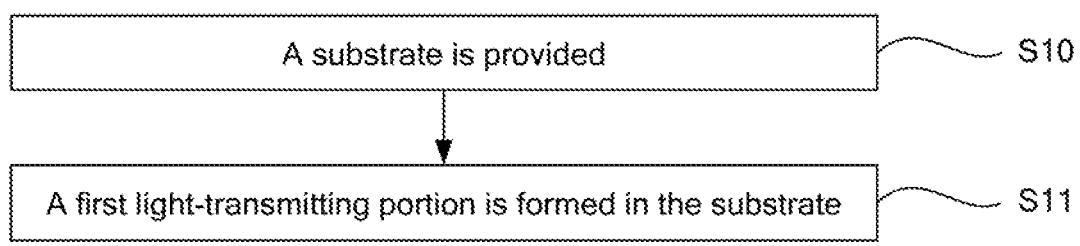
FIG. 10 is a schematic flow diagram of a method for manufacturing a mask, according to some embodiments of the present disclosure.

As shown in FIG. 10, the manufacturing method includes S10 to S11.

In S10, a substrate is provided.

Herein, a material of the substrate is not limited. In some embodiments, the material of the substrate is metal, such as stainless steel.

In S11, a first light-transmitting portion 101 is formed in the substrate.

Herein, the first light-transmitting portion 101 includes a target region 1010 and at least one compensation region 1011 connected to the target region 1010. The area of the planar pattern of each compensation region 1011 is less than the area of the target region 1010. The planar pattern of the target region 1010 includes a plurality of corners, and the planar pattern of each compensation region 1011 extends from one of the plurality of corners.

There is no limitation on how to form the first light-transmitting portion 101 in the substrate. For example, the first light-transmitting portion 101 is formed by using the etching process (such as a laser etching process, a dry etching process or a wet etching process).

Beneficial effects of the method for manufacturing the mask 10 provided by the embodiments of the present disclosure are the same as beneficial effects of the mask 10 provided by the above embodiments, and details are not described herein again.

Figure 11:
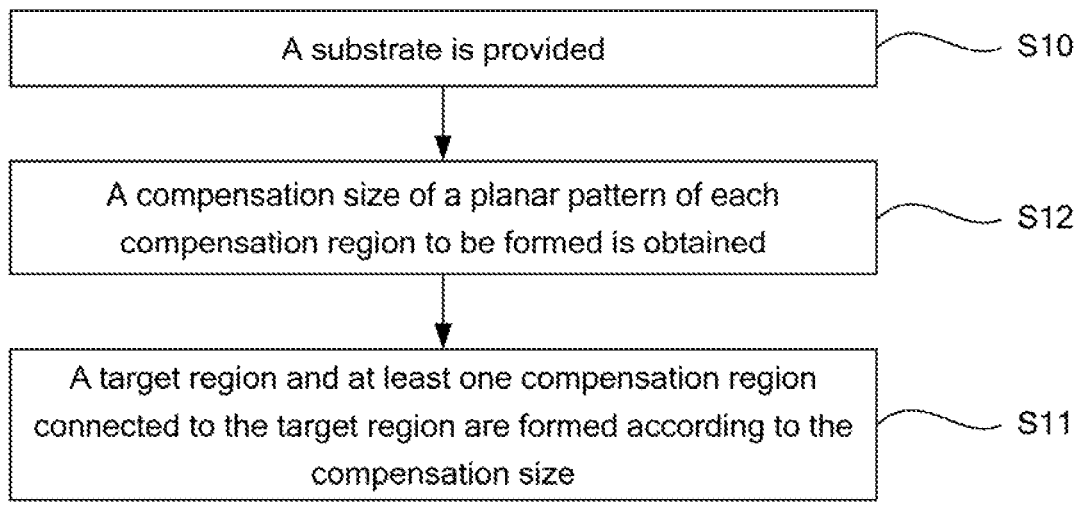
FIG. 11 is a schematic flow diagram of a method for manufacturing another mask, according to some embodiments of the present disclosure.

In some embodiments, before S11, as shown in FIG. 11, the manufacturing method further includes S12.

In S12, a compensation size of a planar pattern of each compensation region 1011 to be formed is obtained.

Correspondingly, S11 includes: forming the target region 1010 and the at least one compensation region 1011 connected to the target region 1010 according to the compensation size.

In some embodiments, S12 includes S121 to S129.

In S121, a test target region having a same planar pattern as the target region 1010 to be formed is obtained.

Herein, the planar pattern of the test target region is a test target pattern including a plurality of corners.

In S122, a test photoresist layer is exposed by using the test target region, and the exposed test photoresist layer is developed to form a test photoresist opening portion corresponding to the test target region.

Herein, a planar pattern of the test photoresist opening portion is a test opening pattern.

In S123, a difference value (also referred to as a critical dimension bias, i.e., CD Bias) between a size of the test target pattern and a size of the test opening pattern at any of the plurality of corners of the test target pattern is obtained.

It will be understood that, the test target region and the target region 1010 to be formed have the same planar pattern, that is, a polygon with sharp corners. Due to the accuracy of the exposure machine, the diffraction effect of light, the etching limitation of the photoresist and the limitation of the wet etching process, an area of the test opening pattern of the formed test photoresist opening portion is less than an area of the test target pattern.

For example, as shown in part (b) in FIG. 2, in a case where a shape of the test target pattern is a rectangle, a shape of the planar pattern of the formed test photoresist opening portion is a circle having an area less than that of the rectangle.

In S124, a test mask light-transmitting portion is obtained.

Herein, the test mask light-transmitting portion includes the test target region and at least one test compensation region connected to the test target region. A planar pattern of each test compensation region extends from one corner of the plurality of corners.

In S125, a plurality of reference sizes related to one test compensation region corresponding to the corner are obtained according to the difference value between the sizes that is obtained in S123.

For example, taking an example in which a shape of the planar pattern of the test compensation region is a rectangle, a plurality of reference sizes related to one test compensation region corresponding to the corner that are obtained according to the difference value between the sizes that is obtained in S123 are 9.5 μm×15 μm, 10 μm×14.5 μm, 10 μm×15 μm, and 10.5 μm×15.5 μm.

In S126, one reference size is sequentially selected from the plurality of reference sizes as a size of the planar pattern of the test compensation region.

In S127, different difference values between a light transmittance of test exposure light passing through a portion of the test target region corresponding to the corner and a light transmittance of the test exposure light passing through a center of the test target region under a same test illumination condition are obtained.

Herein, in some examples, the test mask light-transmitting portion is virtual, that is, an actual mask having the test mask light-transmitting portion is not manufactured. S124 to S127 are performed by using computer simulation software such as high frequency structure simulator (HFSS), or MEEP.

In some other examples, the test mask light-transmitting portion is real. That is, a plurality of actual masks are manufactured, and each mask includes a test mask light-transmitting portion. Or, a single mask is manufactured, and the mask includes a plurality of test mask light-transmitting portions described above. The sizes of the planar patterns of the test compensation regions in the test mask light-transmitting portions are the above reference sizes, respectively. Through a detection device such as a light intensity detector, the light transmittance in the case where the test exposure light passes through the portion of the test target region corresponding to the corner and the light transmittance in the case where the test exposure light passes through the center of the test target region under the same test illumination condition may be obtained, and then the different difference values between the light transmittances may be obtained.

In S128, one reference size corresponding to a minimum value in the different difference values is obtained.

In S129, the reference size is taken as a compensation size of a planar pattern of a compensation region to be formed corresponding to the corner.

For example, in one test compensation region, a size of a planar pattern of the test compensation region is a reference size of 9.5 μm×15 μm, and a difference value of a light transmittance corresponding to the test compensation region is 0.5. In another test compensation region, a size of a planar pattern of the test compensation region is a reference size of 10 μm×14.5 μm, and a difference value of a light transmittance corresponding to the test compensation region is 0.1. In yet another test compensation region, a size of a planar pattern of the test compensation region is a reference size of 10 μm×15 μm, and a difference value of a light transmittance corresponding to the test compensation region is 0.01. In yet another test compensation region, a size of a planar pattern of the test compensation region is a reference size of 10.5 μm×15.5 μm, and a difference value of a light transmittance corresponding to the test compensation region is 0.08. Therefore, the reference size of 10 μm×15 μm is used as the compensation size of the planar pattern of the compensation region to be formed.

Figure 12:
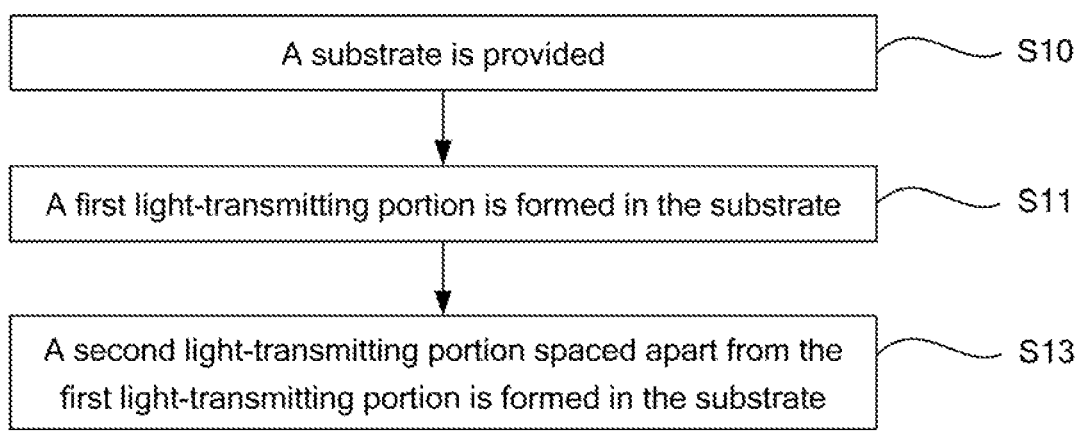
FIG. 12 is a schematic flow diagram of a method for manufacturing yet another mask, according to some embodiments of the present disclosure.

In some embodiments, as shown in FIG. 12, the manufacturing method further includes S13.

In S13, a second light-transmitting portion 102 spaced apart from the first light-transmitting portion 101 is formed in the substrate.

Herein, the area of the planar pattern of the second light-transmitting portion 102 is greater than the area of the planar pattern of the first light-transmitting portion 101.

As for the number, the shape, and the arrangement of the second light-transmitting portion 102, reference may be made to the foregoing embodiments, and details are not described herein again.

In some examples, S13 and S11 may be simultaneously performed. In some other examples, S11 is performed first, and then S13 is performed. In yet some other examples, S13 is performed first, and then S11 is performed. The embodiments of the present disclosure do not limit this, as long as the first light-transmitting portion 101 and the second light-transmitting portion 102 that are spaced apart may be formed in the substrate.

For example, forming the first light-transmitting portion 101 and the second light-transmitting portion 102 that are spaced apart in the substrate includes the following steps.

Partial regions in the substrate are removed by using the etching process to form the first light-transmitting portion 101 and the second light-transmitting portion 102 that are spaced apart.

Herein, the etching process includes any of the laser etching process, the dry etching process, or the wet etching process.

In this way, the first light-transmitting portion 101 and the second light-transmitting portion 102 may be simultaneously formed, thereby simplifying the process of manufacturing the mask.

On the above basis, some embodiments of the present disclosure provide a method for manufacturing a display substrate. The method includes S20 to S22.

In S20, a photoresist layer is formed on a base.

In S21, the photoresist layer is exposed by using the mask 10 provided by the above embodiments.

In S22, the exposed photoresist layer is developed to form a photoresist pattern.

Figure 13:
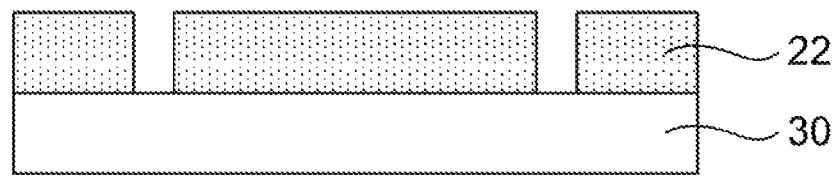
FIG. 13 is a schematic diagram showing a structure of a display substrate, according to some embodiments of the present disclosure.

FIG. 13 is a schematic diagram showing a structure of a manufactured display substrate 02. As shown in FIG. 13, the photoresist pattern 22 includes a BM layer or a pixel defining layer.

It will be understood that, there may also be other structure(s) formed between the base 30 and the photoresist pattern 22 according to different structural designs. For example, in a case where the photoresist pattern 22 includes the pixel defining layer, there are also a thin film transistor (TFT) array layer (i.e., a layer including a plurality of TFTs)

and anodes of a plurality of light-emitting devices formed between the base 30 and the photoresist pattern 22.

In some examples, the photoresist pattern 22 includes the BM layer, and the display substrate 02 is a color filter (CF) substrate.

In some other examples, the photoresist pattern 22 includes the BM layer, and the display substrate 02 is a color filter on array (COA) substrate.

By using the above method for manufacturing the display substrate, a planar pattern of the formed BM layer or the formed pixel defining layer is the same or substantially the same as a preset pattern. In a case where the display substrate 02 is applied to a display panel, and a display area AA of the display panel has a notch region, sizes of a plurality of openings with small sizes in the BM layer or the pixel defining layer that are proximate to the notch region are the same or substantially the same as preset sizes. A situation in which the shape of the planar pattern of the light-transmitting portion 10a of the mask 10' is a rounded rectangle, while the shape of the corresponding opening in the formed BM layer or the formed pixel defining layer is a round hole in the related art does not occur.

In this way, effective display areas of a plurality of sub-pixels corresponding to the openings are not reduced, That is, maximum gray scales that may be displayed do not change. When the display panel displays an image, in a portion of the image at an edge of the notch region, the gray scales displayed by the sub-pixels may progressively change from low to high along a direction from a peripheral region to the display area, thereby making a transition of the gray scales smooth and improving a contrast of the image.

Figure 14:
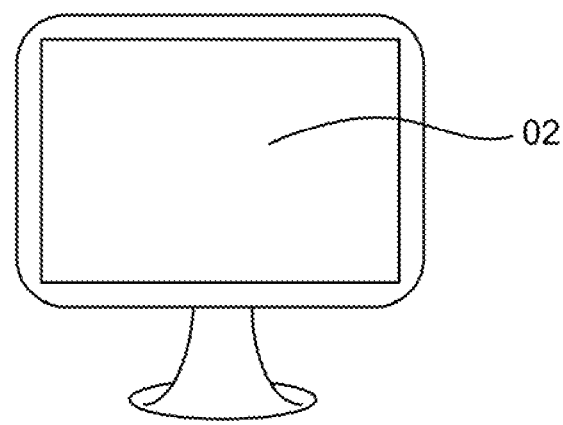
FIG. 14 is a schematic diagram showing a structure of a display device, according to some embodiments of the present disclosure.

On the above basis, as shown in FIG. 14, some embodiments of the present disclosure provide a display device 03 including the display substrate 02 obtained by using the above manufacturing method. Beneficial effects of the display device are the same as beneficial effects of the display substrate provided by the above embodiments, and details are not described herein again.

The display device includes any product or component having a display function, such as a mobile phone, a tablet computer, a television, a display, a notebook computer, a digital photo frame, or a navigator.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A method for manufacturing a mask, comprising:
providing a substrate; and
forming a first light-transmitting portion in the substrate, wherein
the first light-transmitting portion includes:
a target region; and
at least one compensation region connected to the target region, wherein
a planar pattern of the target region includes a plurality of corners, and a planar pattern of each compensation region extends from one of the plurality of corners; and
an area of the planar pattern of each compensation region is less than an area of the planar pattern of the target region,
wherein before forming the first light-transmitting portion in the substrate, the method further comprises:
obtaining a compensation size of the planar pattern of each compensation region to be formed;
forming the first light-transmitting portion in the substrate includes:
forming the target region and the at least one compensation region connected to the target region according to the compensation size,
wherein obtaining the compensation size of the planar pattern of each compensation region to be formed includes:
obtaining a test target region having a same planar pattern as the target region to be formed, wherein the planar pattern of the test target region is a test target pattern including a plurality of corners;
exposing a test photoresist layer by using the test target region, and developing the exposed test photoresist layer to form a test photoresist opening portion corresponding to the test target region, wherein a planar pattern of the test photoresist opening portion is a test opening pattern;
obtaining a difference value between a size of the test target pattern and a size of the test opening pattern at any one of the plurality of corners of the test target pattern;
obtaining a test mask light-transmitting portion, wherein the test mask light-transmitting portion includes: the test target region and at least one test compensation region connected to the test target region, a planar pattern of each test compensation region extending from one corner of the plurality of corners;
obtaining a plurality of reference sizes related to a test compensation region corresponding to the corner according to the difference value between the sizes;
sequentially selecting one reference size from the plurality of reference sizes as a size of the planar pattern of the test compensation region;
obtaining different difference values between a light transmittance of test exposure light passing through a portion of the test target region corresponding to the corner and a light transmittance of the test exposure light passing through a center of the test target region under a same test illumination condition;
obtaining a reference size corresponding to a minimum value in the different difference values; and
taking the reference size as a compensation size of a planar pattern of a compensation region to be formed corresponding to the corner, wherein
obtaining the different difference values between the light transmittance of the test exposure light passing through the portion of the test target region corresponding to the corner and the light transmittance of the test exposure light passing through the center of the test target region under the same test illumination condition, includes:
obtaining, by a light intensity detector, the light transmittance of the test exposure light passing through the portion of the test target region corresponding to the corner and the light transmittance of the test exposure light passing through the center of the test target region under the same test illumination condition; and
obtaining the different difference values.

2. The method according to claim 1, further comprising:
forming a second light-transmitting portion spaced apart from the first light-transmitting portion in the substrate, wherein an area of a planar pattern of the second light-transmitting portion is greater than an area of a planar pattern of the first light-transmitting portion.

3. A mask manufactured by the method according to claim 1, comprising the first light-transmitting portion, wherein the first light-transmitting portion includes:
the target region; and
the at least one compensation region connected to the target region, wherein
the planar pattern of the target region includes the plurality of corners, and the planar pattern of each compensation region extends from the one of the plurality of corners; and
the area of the planar pattern of each compensation region is less than the area of the planar pattern of the target region.

4. The mask according to claim 3, wherein a shape of the planar pattern of the target region includes any one of following shapes:
a triangle, a rectangle, a trapezoid, a rhombus, a pentagon, or a hexagon.

5. The mask according to claim 3, wherein the at least one compensation region includes a plurality of compensation regions in one-to-one correspondence with the plurality of corners.

6. The mask according to claim 5, wherein planar patterns of the plurality of compensation regions are the same.

7. The mask according to claim 3, wherein a planar pattern of any compensation region is connected to one side or two sides of a corresponding corner.

8. The mask according to claim 7, wherein in a case where a planar pattern of any compensation region is connected to two sides of a corresponding corner,
a shape of a combined pattern composed of the planar pattern of the compensation region and the corresponding corner includes any one of following shapes:
a triangle, a rectangle, a trapezoid, a rhombus, a circle, or an ellipse.

9. The mask according to claim 8, wherein a shape of the planar pattern of the target region includes a rectangle with each side length of L0;
the shape of the combined pattern includes a rectangle with each side length of L1 or a circle with a diameter of L1; and
a ratio of L0 to L1 is 5:2.

10. The mask according to claim 7, wherein in a case where a planar pattern of any compensation region is connected to one side of a corresponding corner,
a shape of the planar pattern of the compensation region includes any one of following shapes:
a triangle, a rectangle, a trapezoid, or a rhombus.

11. The mask according to claim 10, wherein a shape of the planar pattern of the target region includes a rectangle with each side length of $L_0$;
the shape of the planar pattern of the compensation region includes a rectangle with each side length of $L_1$; and
a ratio of $L_0$ to $L_1$ is 5:2.

12. The mask according to claim 3, wherein the first light-transmitting portion is a first opening portion.

13. The mask according to claim 3, further comprising a second light-transmitting portion spaced apart from the first light-transmitting portion, wherein
an area of a planar pattern of the second light-transmitting portion is greater than an area of a planar pattern of the first light-transmitting portion.

14. The mask according to claim 13, wherein the second light-transmitting portion is a second opening portion.

15. An exposure system, comprising:
the mask according to claim 3; and
a light source configured to provide exposure light.

16. A method for manufacturing a display substrate, comprising:
forming a photoresist layer on a base;
exposing the photoresist layer by using the mask according to claim 3; and
developing the exposed photoresist layer to form a photoresist pattern.

17. A display device, comprising a display substrate obtained by using the method according to claim 16.

18. The display device according to claim 17, wherein the photoresist pattern in the display device includes a black matrix layer or a pixel defining layer.

* * * * *